United States Patent
Zheng et al.

(10) Patent No.: US 11,901,293 B2
(45) Date of Patent: Feb. 13, 2024

(54) POWER UNIT, POWER MODULE AND INVERTER

(71) Applicant: SUNGROW POWER SUPPLY CO., LTD., Anhui (CN)

(72) Inventors: Hao Zheng, Anhui (CN); Qiyao Zhu, Anhui (CN); Jin Zhang, Anhui (CN)

(73) Assignee: SUNGROW POWER SUPPLY CO., LTD., Anhui (CN)

(*) Notice: Subject to any disclaimer, the term of this patent is extended or adjusted under 35 U.S.C. 154(b) by 405 days.

(21) Appl. No.: 17/205,548

(22) Filed: Mar. 18, 2021

(65) Prior Publication Data

US 2021/0327811 A1 Oct. 21, 2021

(30) Foreign Application Priority Data

Apr. 20, 2020 (CN) .......................... 202020585403.8

(51) Int. Cl.
*H01L 23/528* (2006.01)
*H02M 7/483* (2007.01)
(Continued)

(52) U.S. Cl.
CPC .......... *H01L 23/5286* (2013.01); *H01L 23/50* (2013.01); *H01L 29/7393* (2013.01); *H02M 7/483* (2013.01)

(58) Field of Classification Search
CPC ... H01L 23/267; H01L 23/427; H01L 23/467; H01L 23/538; H01L 25/18; H01L 25/07;
(Continued)

(56) References Cited

U.S. PATENT DOCUMENTS 5,459,655 A * 10/1995 Mori ................ H03K 17/08148
363/43
5,576,943 A * 11/1996 Keir ...................... H02M 7/538
363/56.05
(Continued)

FOREIGN PATENT DOCUMENTS

CN 209709698 * 11/2019
CN 209709698 U 11/2019
(Continued)

OTHER PUBLICATIONS

Extended European Search Report regarding Application No. 21163825.9 dated Aug. 17, 2021.

*Primary Examiner* — Thienvu V Tran
*Assistant Examiner* — Nusrat Quddus
(74) *Attorney, Agent, or Firm* — Harness, Dickey & Pierce, P.L.C.

(57) ABSTRACT

An inverter, a power unit and a power module applied to the inverter are provided. The power unit includes a first package module, a second package module, and a third package module, each including two switch transistors that are complementary to each other. Since the first package module and the second package module are arranged in one half of the inner space of the power unit, and the third package module is arranged in the other half of the inner space of the power unit, the control terminal of each of the three package modules is arranged on a side of the half for arranging the package module that is away from the other half. Thus, the power unit can adopt a small-sized packaging structure without changing a layout of driver boards, thereby reducing the cost of the power unit and the inverter.

16 Claims, 7 Drawing Sheets

(51) Int. Cl.
  *H01L 23/50* (2006.01)
  *H01L 29/739* (2006.01)
(58) Field of Classification Search
  CPC ...... H01L 25/11; H01L 25/112; H01L 25/115;
    H01L 23/34; H01L 25/00; H01L 25/10;
    H01L 25/177; H01L 29/00; H05K 7/20;
    H05K 5/0021; H05K 5/0247; H05K
    7/20336; H05K 7/209; H05K 7/20936;
    H05K 7/20927; H05K 7/1432; H05K
    7/1422; H05K 7/14322; H02M 7/00;
    H02M 7/003; H02M 7/493; H02M 1/10;
    H02M 3/33561; H02M 3/073; H02M
    3/10; H02M 3/135; H02M 3/137; H02M
    3/28; H02M 3/315; H02M 3/3155; H02M
    3/325; H02M 3/335; H02M 7/10; H02M
    7/515; H02M 7/521; H02M 7/53; H02M
    7/537; H02M 7/5383; H02M 7/538466;
    H02M 7/53862; H02M 7/5387; H02M
    7/53871; H02M 7/53875; H02M 7/757;
    H02M 7/79; H02M 3/337; H02M 3/338;
    H02M 3/3382; H02M 3/3384; H02M
    7/538; H02M 7/53806; H02M 7/53832;
    H02M 7/53835; H02M 7/539; H02M
    7/23; H02M 7/217; H02M 7/21; H02M
    7/12; H02M 7/04; H02M 7/483–487;
    H02M 7/1432; H02J 3/38; G06F 1/263;
    H01R 13/6675; H01R 29/00; H01R
    31/065; G09G 3/20; H02K 11/046; H01F
    2027/406
  USPC .......................................................... 363/132
  See application file for complete search history.

(56) References Cited

U.S. PATENT DOCUMENTS

| | | | | |
|---|---|---|---|---|
| 5,731,970 | A * | 3/1998 | Mori | H01L 24/49 |
| | | | | 363/43 |
| 5,953,222 | A * | 9/1999 | Mizutani | H03K 17/567 |
| | | | | 363/56.05 |
| 6,072,707 | A * | 6/2000 | Hochgraf | H02M 7/5387 |
| | | | | 363/136 |
| 7,505,294 | B2 * | 3/2009 | Ahmed | H02M 7/53871 |
| | | | | 363/141 |
| 8,564,994 | B2 * | 10/2013 | Capitaneanu | H02M 7/487 |
| | | | | 363/95 |
| 8,653,652 | B2 * | 2/2014 | Tokuyama | H01L 24/34 |
| | | | | 257/E23.101 |
| 9,254,928 | B2 * | 2/2016 | Fukuda | G16H 20/17 |
| 9,966,875 | B2 * | 5/2018 | Wang | H02M 7/483 |
| 11,183,440 | B2 * | 11/2021 | Lu | H01L 29/2003 |
| 2004/0095790 | A1 * | 5/2004 | Bakran | H02M 7/487 |
| | | | | 363/132 |
| 2006/0273592 | A1 * | 12/2006 | Yamabuchi | H02M 7/003 |
| | | | | 290/40 C |
| 2006/0274561 | A1 * | 12/2006 | Ahmed | H02M 7/003 |
| | | | | 361/699 |
| 2010/0208446 | A1 * | 8/2010 | Lapassat | H05K 7/14337 |
| | | | | 361/810 |
| 2011/0013438 | A1 * | 1/2011 | Frisch | H03K 17/6871 |
| | | | | 363/131 |
| 2011/0249479 | A1 * | 10/2011 | Capitaneanu | H02M 7/487 |
| | | | | 363/132 |
| 2012/0243273 | A1 * | 9/2012 | Rasoanarivo | H02M 5/293 |
| | | | | 363/41 |
| 2013/0051105 | A1 * | 2/2013 | Wang | H02M 1/42 |
| | | | | 363/132 |
| 2014/0169054 | A1 * | 6/2014 | Ogawa | H02M 7/003 |
| | | | | 361/728 |
| 2015/0222201 | A1 * | 8/2015 | Nakashima | H05K 7/1432 |
| | | | | 363/131 |
| 2015/0349676 | A1 * | 12/2015 | Kemper | H02K 11/33 |
| | | | | 318/504 |
| 2017/0062386 | A1 * | 3/2017 | Wang | H01L 24/49 |
| 2017/0187304 | A1 * | 6/2017 | Fujii | H02M 7/003 |
| 2018/0084666 | A1 * | 3/2018 | Schulz | H05K 7/209 |
| 2018/0097453 | A1 * | 4/2018 | Xu | H02M 7/48 |
| 2018/0262124 | A1 * | 9/2018 | Hsin | H02M 7/487 |
| 2018/0309384 | A1 * | 10/2018 | Wang | H02M 7/487 |
| 2018/0351368 | A1 * | 12/2018 | Sun | H02M 3/33584 |
| 2019/0019785 | A1 * | 1/2019 | Nakashima | H01L 23/055 |
| 2019/0267912 | A1 * | 8/2019 | Ishino | H01L 24/42 |
| 2019/0335628 | A1 * | 10/2019 | Lei | H01L 23/473 |
| 2020/0343823 | A1 | 10/2020 | Zheng et al. | |
| 2020/0366216 | A1 * | 11/2020 | Usui | H05K 1/181 |
| 2022/0271682 | A1 * | 8/2022 | Zheng | H01L 23/50 |
| 2023/0110879 | A1 * | 4/2023 | Ewald | H02M 7/003 |
| | | | | 363/132 |

FOREIGN PATENT DOCUMENTS

| | | | | |
|---|---|---|---|---|
| DE | 102019114040 A1 * | 11/2020 | ....... | H01L 23/49541 |
| EP | 2884650 A1 | 6/2015 | | |
| EP | 3731397 A1 | 10/2020 | | |
| WO | WO-2015090627 A1 * | 6/2015 | ........... | H02M 5/458 |
| WO | WO-2021016382 A1 * | 1/2021 | ......... | H02M 1/0043 |

* cited by examiner

POWER UNIT, POWER MODULE AND INVERTER

The present disclosure claims the priority to Chinese Patent Application No. 202020585403.8, titled "INVERTER, AND POWER UNIT AND POWER MODULE APPLIED THERETO", filed on Apr. 20, 2020, with the China National Intellectual Property Administration, the content of which is incorporated herein by reference.

FIELD

The present disclosure relates to the technical field of power electronics, and particularly, to an inverter, and a power unit and a power module applied to an inverter.

BACKGROUND

At present, an electronic energy conversion device usually includes multiple power units that have a same topology and that are connected in parallel to each other for performing power conversion. The multiple power units, each of which is individually packaged, are connected in parallel with each other, to form the electronic energy conversion device, so as to save costs and facilitate maintenance of the electronic energy conversion device.

Under a certain power, it is more cost-effective to form the power module in the electronic energy conversion device by a larger number of parallel-connected low-power power units as compared with a smaller number of parallel-connected high-power power units. In addition, the low-power power units are technically mature, and can be packaged in a wide variety of methods.

However, an inverter having a three-level topology is not suitable for the small-sized (for example, 62 mm) low-power power unit package structure, resulting in a higher overall cost of the inverter.

SUMMARY

In view of the above, an inverter, a power unit and a power module applied to the inverter are provided according to embodiments of the present disclosure, so as to reduce the cost of the inverter.

Following technical solutions are provided according to embodiments of the present disclosure.

In a first aspect of the present disclosure, a power unit applied to an inverter is provided. The power unit includes: a first package module, a second package module, and a third package module. Each of the first package module, the second package module and the third package module is provided with two switch transistors that are complementary to each other. The first package module and the second package module are arranged in one half of an inner space of the power unit, and the third package module is arranged in another half of the inner space of the power unit. A control terminal of the first package module and a control terminal of the second package module are arranged on a first side of the power unit that is away from the half of the inner space for arranging the third package module, and a control terminal of the third package module is arranged on a second side of the power unit that is away from the half of the inner space for arranging the first package module and second package module.

In an embodiment, the power unit has a three-level topology, two input terminals of the first package module are respectively connected to a positive electrode and a neutral point of the inverter on a direct current (DC) side of the inverter, two input terminals of the second package module are respectively connected to a negative electrode and the neutral point of the inverter on the DC side of the inverter, the two input terminals of the first package module and the two input terminals of the second package module serve as a DC side of the power unit, the output terminal of the first package module and the output terminal of the second package module are respectively connected to two input terminals of the third package module, and an output terminal of the third package module serves as an alternating current (AC) side of the power unit, and is connected to an AC side of the inverter.

In an embodiment, the output terminal of the first package module and the output terminal of the second package module are respectively connected to the two input terminals of the third package module through copper bars.

In an embodiment, the first package module, the second package module, and the third package module have a Y-shaped arrangement.

In an embodiment, the power unit is configured as a 62 mm series IGBT module.

In a second aspect of the present disclosure, a power module applied to an inverter is provided. The power module includes at least two power units as described in any one of the above embodiment of the first aspect. Terminals serving as DC sides of the at least two power units are connected with each other in parallel, and terminals serving as AC sides of the at least two power units are connected with each other in parallel.

In an embodiment, output terminals of first package modules in the at least two power units are connected with each other through a first circulation bus; and output terminals of second package modules in the at least two power units are connected with each other through a second circulation bus.

In an embodiment, the number of the at least two power units is 4.

In a third aspect, an inverter is provided according to the present disclosure. The inverter includes: a DC input bus, an AC bus bar, an AC output copper bar, and the power module according to any one of the embodiment of the second aspect. Terminals serving as DC sides of the at least two power units are connected to respective electrodes of the DC input bus. Terminals serving as AC sides of the at least two power units are connected to the AC output copper bar through the AC bus bar. Paths passing through the at least two power units between the DC input bus and the AC bus bar have a same impedance.

In an embodiment, a DC input point of the DC input bus and an AC output point of the AC output copper bar are respectively arranged at positions that are symmetrical to each other with respect to a central point of the power module.

In an embodiment, the DC input point and the AC output point are respectively located at two corners of the power module that are opposite to each other in a diagonal direction.

In an embodiment, the AC bus bar includes a parallel confluence copper bar, the parallel confluence copper bar is connected to the AC output copper bar and the terminals serving as the AC sides of the at least two power units. Alternatively, the AC bus bar includes a parallel confluence copper bar and multiple parallel copper bars, the parallel confluence copper bar is connected to the AC output copper bar and one or more of the multiple parallel copper bars, and at least two of the multiple parallel copper bars are connected to terminals serving as AC sides of two or more of the at least two power units.

In an embodiment, in a case that the number of the at least two power units in the power module is four, and the AC bus bar includes: a first parallel copper bar, a second parallel copper bar and a parallel confluence copper bar. The first parallel copper bar is connected to terminals serving as AC sides of two of the four power units on a left side of the power module; the second parallel copper bar is connected to terminals serving as AC sides of another two of the four power units on a right side of the power module. A left end of the parallel confluence copper bar is connected to a middle point of the first parallel copper bar, and a right end of the parallel confluence copper bar is connected to a left end of the second parallel copper bar. The left end of the parallel confluence copper bar is connected to the AC output copper bar, and the DC input point is arranged at an upper right corner of the power module.

In an embodiment, the inverter further includes a radiator, where the at least two power unit are sequentially arranged on the radiator.

In an embodiment, the first package module and the second package module in each of the at least two power units are arranged at a cold air end of the radiator, and the third package module in each of the at least two power units is arranged at a hot air end of the radiator.

In an embodiment, the inverter further includes: at least one first heat pipe, and/or at least one second heat pipe. In a case that the inverter includes the at least one first heat pipe, each of the at least one first heat pipe is arranged on a same cross section of halves of inner spaces for arranging the third package module, of two or more of the at least two power units. In a case that the inverter includes the at least one second heat pipe, each of the at least one second heat pipe is arranged on a same cross section of halves of inner spaces for arranging the first package module and the second package module, of two or more of the at least two power units.

In an embodiment, the inverter further includes a controller, a first driver board, and a second driver board. One side of the first driver board is connected to the control terminals on the first side of each of the at least two power units. One side of the second driver board is connected to the control terminal on the second side of each of the at least two power units. Another side of the first driver board and another side of the second driver board are connected to the controller.

According to the aforementioned technical solutions, a power unit applied to an inverter is provided according to the present disclosure. The power unit includes a first package module, a second package module, and a third package module, where each of the first package module, the second package module and the third package module is provided with two switch transistors that are complementary to each other. Since the first package module and the second package module are arranged in one half of the inner space of the power unit, and the third package module is arranged in the other half of the inner space of the power unit, the control terminal of each of the three package modules is arranged on a side of the half for arranging the package module that is away from the other half. Thus, the power unit can adopt a small-sized packaging structure, such as a 62 mm series IGBT module, without changing a layout of driver boards, thereby reducing the cost of the power unit and the inverter.

BRIEF DESCRIPTION OF THE DRAWINGS

For clearer illustration of the technical solutions according to embodiments of the present disclosure or conventional techniques, hereinafter are briefly described the drawings to be applied in embodiments of the present disclosure or conventional techniques. Apparently, the drawings in the following descriptions are only some embodiments of the present disclosure, and other drawings may be obtained by those skilled in the art based on the provided drawings without creative efforts.

DETAILED DESCRIPTION

Figure 1:
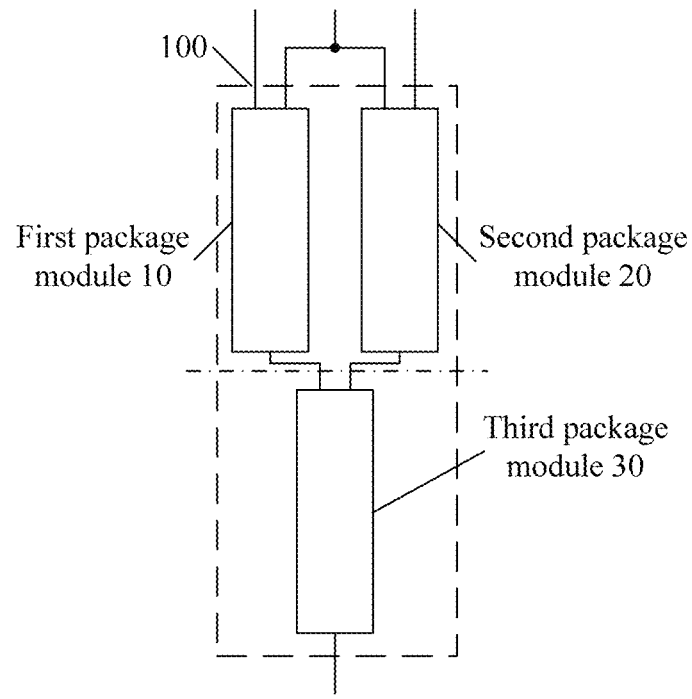
FIG. 1 is a schematic structural diagram of a power unit applied to an inverter according to an embodiment of the present disclosure.

The technical solutions in the embodiments of the present disclosure will be described clearly and completely hereinafter in conjunction with the drawings in the embodiments of the present disclosure. Apparently, the described embodiments are only some rather than all of the embodiments of the present disclosure. Any other embodiments obtained based on the embodiments of the present disclosure by those skilled in the art without any creative effort fall within the scope of protection of the present disclosure.

In the present disclosure, the term "include", "comprise" or any variant thereof is intended to encompass nonexclusive inclusion so that a process, method, article or device including a series of elements includes not only those elements but also other elements which have not been listed definitely or an element(s) inherent to the process, method, article or device. Moreover, the expression "comprising a(n) . . . " in which an element is defined will not preclude presence of an additional identical element(s) in a process, method, article or device comprising the defined element(s) unless further defined.

A conventional inverter is produced at a high cost. In order to reduce the cost of the inverter, a power unit 100 applied to an inverter is provided according to an embodiment of the present disclosure. The structure of the power unit 100 is shown in the dashed box in FIG. 1. The power unit 100 includes: a first package module 10, a second package module 20 and a third package module 30. Each of the first package module 10, the second package module 20 and the third package module 30 is provided with two switch transistors that are complementary to each other.

In an embodiment, in a case that the power unit 100 is arranged in an inverter, two input terminals of the first package module 10 are respectively connected to a positive electrode and a neutral point of the inverter on a DC side of the inverter. Two input terminals of the second package module 20 are respectively connected to a negative electrode and the neutral point of the inverter on the DC side of the inverter. An output terminal of the first package module 10 and an output terminal of the second package module 20 are respectively connected to two input terminals of the third package module 30. An output terminal of the third package module 30 is connected to an AC side of the inverter. The first package module 10, the second package module 20 and the third package module 30 form the power unit 100 having a three-level topology, thereby improving the efficiency and quality of the inverter.

The output terminal of the first package module 10 and the output terminal of the second package module 20 may be respectively connected to the two input terminals of the third package module 30 through copper bars or cables.

It should be noted that, when the inverter operates under a large current, package modules in each power unit generates heat at different times, thus the heat generated by each power unit is in a safe range, so as to prevent the inverter from being damaged by great heat. Therefore, by connecting the three package modules in the aforementioned manner, the power unit 100 including the three package modules and having the three-level topology ensures that the inverter is capable of operating under a large current.

In the power unit 100, the first package module 10 and the second package module 20 are arranged in one half of an inner space of the power module 100, and the third package module 30 is arranged in the other half of the inner space of the power module 100.

In an embodiment, the power unit 100, when packaged, has a rectangular shape, and the inner space of the power unit 100 may be divided into two halves by a middle line perpendicular to a longer side of the power unit 100, as shown by the dot dash line in FIG. 1, where the third package module 30 being arranged in a lower half is shown as an example, and the third package module 30 may alternatively be arranged in an upper half in practice. Alternatively, the inner space of the power unit 100 may be divided into two halves by a middle line perpendicular to a shorter side of the power unit 100, as shown by the dot dash line in FIG. 2, where the third package module 30 being arranged in a right half is shown as an example, and the third package module 30 may alternatively be arranged in a left half in practice. The manner in which the inner space is divided and in which the package modules are arranged is not limited in the present disclosure, and may be set according to actual conditions.

It should be noted that, since each package module in the packaged power unit 100 also has a rectangular shape, a longer side of each package module is required to be parallel to the longer side of the power unit 100 when the inner space of the power unit 100 is divided in any one of the two above manners.

In a preferred embodiment, the three package modules in the power unit 100 have a Y-shaped arrangement. However, the arrangement of the three package modules in the power unit 100 includes but is not limited to the aforementioned arrangement. The first package module 10, the second package module 20, and the third package module 30 may have another arrangement, such as an inverted Y-shape, a horizontal Y-shape or may be arranged in sequence, which may be selected according to actual conditions and is not limited in the present disclosure, all of which falls within the scope of the present disclosure.

In a case that the inner space of the power unit 100 is divided by the middle line perpendicular to the longer side of the power unit 100, as shown in FIG. 1, the three package modules in the power unit 100 having the Y-shaped arrangement indicates that the third package module 30 is arranged in the lower half of the inner space of the power unit 100, with a symmetry axis of the third package module 30 that is parallel to the longer side of the package module 30 being in the middle of the lower half, that is, the third package module 30 is located in the middle of the lower half; and the first package module 10 and the second package module 20 are arranged in the upper half of the inner space of the power unit 100 and are symmetrical to each other with respect to the symmetry axis of the third package module 30.

Figure 2:
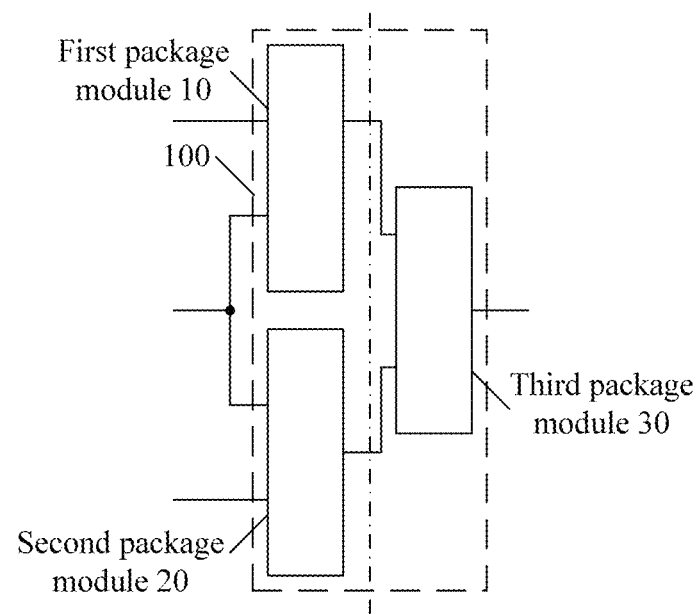
FIG. 2 is a schematic structural diagram of a power unit applied to an inverter according to an embodiment of the present disclosure.

In a case that the inner space of the power unit 100 is divided by the middle line perpendicular to the shorter side of the power unit 100, as shown in FIG. 2, the three package modules in the power unit 100 having the Y-shaped arrangement indicates that the third package module 30 is arranged in the right half of the inner space of the power unit 100, with a symmetry axis of the third package module 30 that is perpendicular to the longer side of the package module 30 being in the middle of the right half, that is, the third package module 30 is located in the middle of the right half of the inner space of the power unit 100; and the first package module 10 and the second package module 20 are arranged in the left half of the inner space of the power unit 100 and are symmetrical to each other with respect to the symmetry axis of the third package module 30.

In the power unit 100, a control terminal of the first package module 10 and a control terminal of the second package module 20 are located on a first side of the power unit 100 that is away from the half of the inner space for arranging the third package module 30, and a control terminal of the third package module 30 is located on a second side of the power unit 100 that is away from the half of the inner space for arranging the first package module 10 and the second package module 20, thereby facilitating connection with an driver board inside the inverter.

In a case that the inner space of the power unit 100 is divided in the manner shown in FIG. 1, the first package module 10 and the second package module 20 are arranged in the upper half of the inner space of the power unit 100, the control terminals of the first package module 10 and the second package module 20 are located on the upper side of the power unit 100. Referring to the upper left part of FIG. 3, the upper side of the power unit 100 is the first side of the power unit 100. The third package module 30 is arranged in the lower half of the inner space of the power unit 100, and the control terminal of the third package module 30 is located on the lower side of the power unit 100, referring to the lower left part of FIG. 3, the lower side of the power unit 100 is the second side of the power unit 100.

Similarly, in a case that the inner space of the power unit 100 is divided in the manner shown in FIG. 2, the first package module 10 and the second package module 20 are arranged in the left half of the inner space of the power unit 100, the control terminals of the first package module 10 and the second package module 20 are located on the left side of the power unit 100, and the left side of the power unit 100 is the first side of the power unit 100. The third package module 30 is arranged in the right half of the inner space of the power unit 100, and the control terminal of the third package module 30 is located on the right side of the power unit 100, and the right side of the power unit 100 is the second side of the power unit 100.

Figure 3:
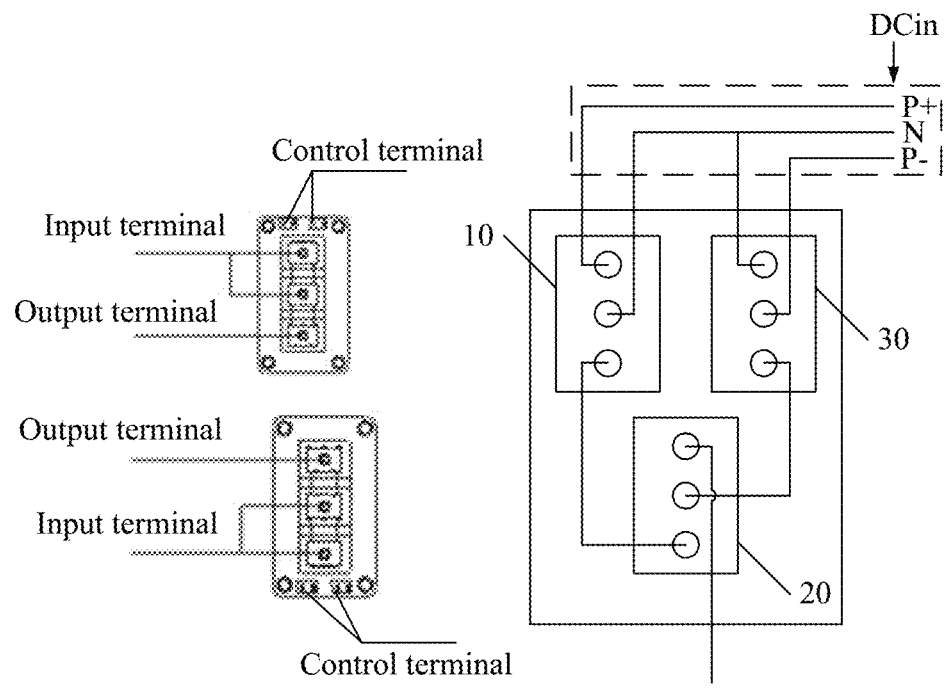
FIG. 3 is a schematic diagram of terminals of package modules in a power module according to an embodiment of the present disclosure.

In a case that the three package modules are arranged in the aforementioned manners, a small-sized package structure may be adopted for the power unit 100, for example, a 62 mm series IGBT module as shown in FIG. 3 may be adopted, thereby reducing the cost of the power unit.

It can be seen from the above that, each of the first package module 10, the second package module 20 and the third package module 30 includes two switch transistors that are complementary to each other. The first package module 10 and the second package module 20 are arranged in one half of the inner space of the power unit 100, and the third package module 30 is arranged in the other half of the inner space of the power unit 100. The control terminal of each of the package modules is arranged on a side of the half for arranging the package module that is away from the other half. Thus, the power unit can adopt a small-sized packaging structure, such as a 62 mm series IGBT module, without changing a layout of driver boards, thereby reducing the cost of the power unit 100 and the inverter. In addition, driver boards for the power unit 100 according to the embodiment may have a simple layout. Moreover, since the two input terminals of the first package module 10 and the two input terminals of the second package module 20 are on the same side, a structure design of a DC input bus 50 is facilitated. In other words, the DC input bus 50 can have a simple structure.

Figure 4:
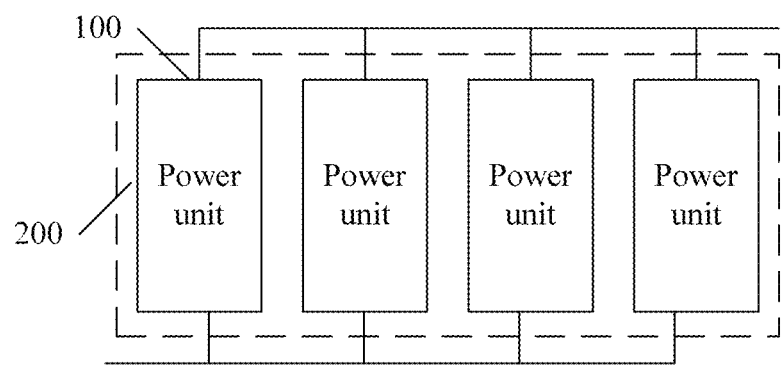
FIG. 4 is a schematic structural diagram of a power module according to an embodiment of the present disclosure.

Referring to FIG. 4, a power module 200 applied to an inverter is provided according to an embodiment of the present disclosure. The power module 200 includes at least two power units 100 according to the aforementioned embodiment of the present disclosure. A power module including four power units 100 is shown in FIG. 4 as an example.

In the power module 200, DC sides of all of the at least two power units 100 are connected with each other in parallel, and AC sides of all of the at least two power units 100 are connected with each other in parallel. The DC side of the power unit 100 refers to the input terminals of the first package module and the input terminals of the second package module described in the aforementioned embodiment. The AC side of the power unit 100 refers to the output terminal of the third package module described in the aforementioned embodiment.

It should be noted that, the power module 200 formed by the multiple power units 100 that are connected with each other in parallel may have a small parasitic inductance and a high power level, resulting in an inverter having a high power level. Further, the driver boards and the DC input bus 50 can have simple layout and configuration.

In a preferred embodiment, the power module 200 includes four power units 100 according to the aforementioned embodiment of the present disclosure.

In applications, if the power module 200 includes a large number of power units 100, currents through the power units 100 are different since the actual accuracy in the packaging process of each power unit 100 is different from the ideal accuracy. As a result, some power units 100 may bear higher currents, and are more easily damaged.

Figure 5:
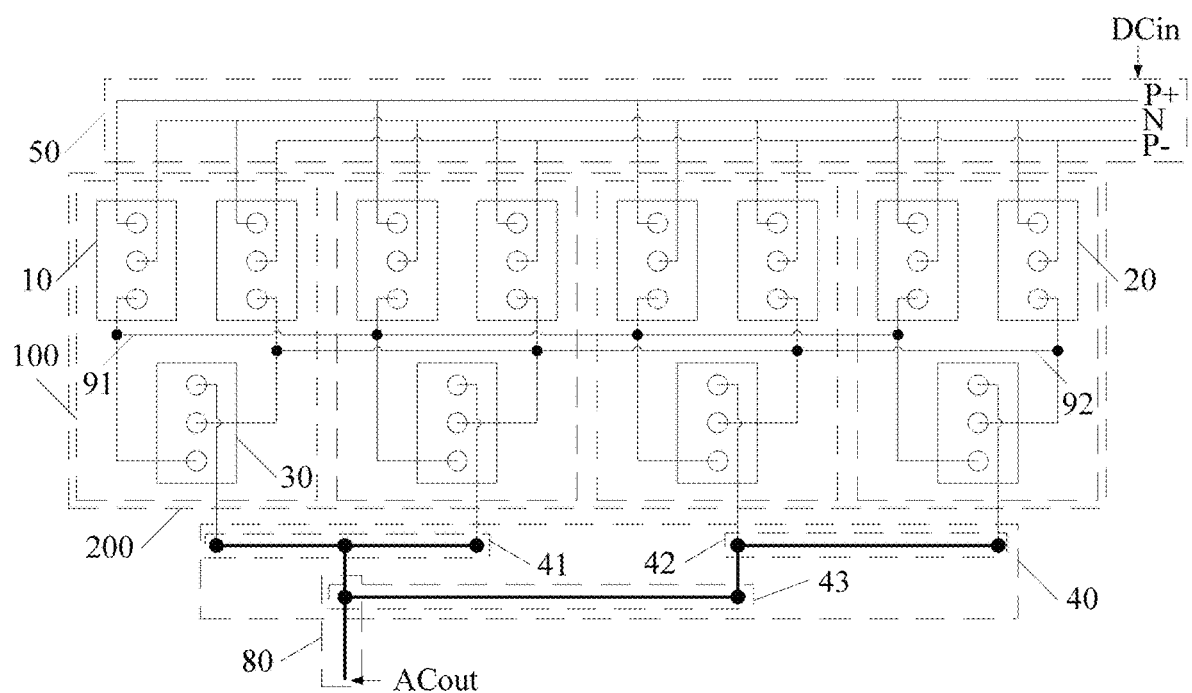
FIG. 5 is a schematic structural diagram of an inverter according to an embodiment of the present disclosure.

In order to solve the above problem, two circulation buses are provided in the power module 200, that is, a first circulation bus 91 and a second circulation bus 92 as shown in FIG. 5. In an embodiment, output terminals of first package modules 10 in all power units 100 are connected with each other through the first circulation bus 91, and output terminals of second package modules 20 in all power units 100 are connected with each other through the second circulation bus 92.

Due to the first circulation bus 91 and the second circulation bus 92, the output terminals of the first package modules 10 in all power unit 100 have a same potential, and the output terminals of the second package modules 20 in all power units 100 have a same potential. That is, potentials of the output terminals of the first package modules 10 in all power units 100 are made equal to each other, and potentials of the output terminals of the second package modules 20 in all power units 100 are made equal to each other, thereby avoiding the unequal currents that cause overload of some power units 100, so as to prevent the power units from being damaged.

Referring to FIG. 5, an inverter is provided according to an embodiment of the present disclosure. The inverter includes: a DC input bus 50, an AC bus bar 40, an AC output copper bar 80, and the power module 200 according to the aforementioned embodiment of the present disclosure.

In the power module 200, terminals serving as DC sides of all of the at least two power units 100, that is, the input terminals of the first package modules 10 and the input terminals of the second package modules 20 are connected to respective electrodes of the DC input bus 50.

The DC input bus 50 includes a DC input positive bus P+, a DC input neutral bus N, and a DC input negative bus P−. In the power module 200, positive input terminals of the first package modules 10 in all power units 100 are connected to the DC input positive bus P+. Negative input terminals of the first package modules 10 in all power units 100 are connected to the DC input neutral bus N. Positive input terminals of the second package modules 20 in all power units 100 are connected to the DC input neutral bus N. Negative input terminals of the second package modules 20 in all power units 100 are connected to the DC input negative bus P−.

The inverter adopts the power module 200 according to the aforementioned embodiments, such that the DC input bus 50 of the inverter can have a simple configuration.

In the power module 200, terminals serving as AC sides of all power units 100, that is, output terminals of the third package modules 30, are connected to the AC output copper bar 80 through the AC bus bar 40.

A structure of the AC bus bar 40 will be described hereinafter by taking the power module 200 including four power units 100 as an example. As shown in FIG. 5, the AC bus bar 40 includes a first parallel copper bar 41, a second parallel copper bar 42 and a parallel confluence copper bar 43.

Two ends of the first parallel copper bar 41 are respectively connected to terminals serving as AC sides of two power units 100 on a left side of the power module, and two ends of the second parallel copper bar 42 are connected to terminals serving as AC sides of another two power units 100 on a right side of the power module respectively. A left end of the parallel confluence copper bar 43 is connected to a middle point of the first parallel copper bar 41, and a right end of the parallel confluence copper bar 43 is connected to a left end of the second parallel copper bar 42. The left end of the parallel confluence copper bar 43 is connected to the AC output copper bar 80. A DC input point is arranged at an upper right corner of the power module 200.

In applications, the AC bus bar 40 may include at least one parallel copper bar and one parallel confluence copper bar 43. Alternatively, the AC bus bar 40 may include only the parallel confluence copper bar 43. The number of the parallel copper bars, and whether the parallel copper bar is included are not limited in the present disclosure and may be selected according to actual conditions.

In a case that the AC bus bar 40 has one level, the AC bus bar 40 includes only the parallel confluence copper bar 43, and the parallel confluence copper bar 43 is connected to terminals serving as the AC sides of all power units 100.

In a case that the AC bus bar 40 has two levels, the AC bus bar 40 includes at least one parallel copper bar and one parallel confluence copper bar 43. The at least one parallel copper bar forms the first level, and each of the at least one parallel copper bar is connected to terminals serving as AC sides of at least two corresponding power units 100. In this case, there may be one or more power units 100 that are not connected to the parallel copper bar, or all power units 100 may be connected to corresponding parallel copper bars, which depends on actual conditions and is not limited herein, all of which falls within the protection scope of the present disclosure. The parallel confluence copper bar 43 forms the second level. The parallel confluence copper bar 43 may be connected to all power units via all parallel copper bars, or the parallel confluence copper bar 43 may be connected to all parallel copper bars and terminals serving as the AC sides of the one or more power units 100 that are not connected to the parallel copper bar, which depends on actual conditions and is not limited herein, all of which falls within the protection scope of the present disclosure.

In a case that the AC bus bar 40 has multiple levels, the AC bus bar 40 includes at least two parallel copper bars and one parallel confluence copper bar 43. All parallel copper bars are divided into multiple levels. A lowest-level parallel copper bar is connected to terminals serving as AC sides of at least two corresponding power units 100. In this case, there may be one or more power units 100 that are not connected to the parallel copper bar, or all power units 100 may be connected to corresponding parallel copper bars, which depends on actual conditions and is not limited herein, all of which falls within the protection scope of the present disclosure. Except for the lowest-level parallel copper bar, a higher-level parallel copper bar may be connected to a parallel copper bar that has a level lower than the higher-level parallel copper bar and is not connected to a parallel copper bar having a level higher than the higher-level parallel copper bar. That is, the higher-level parallel copper bar may be connected to only at least two parallel copper bars that have a level lower than the higher-level parallel copper bar and are not connected to a parallel copper bar having a level higher than the higher-level parallel copper bar, or the higher-level parallel copper bar may be connected to the parallel copper bar that has a level lower than the higher-level parallel copper bar and is not connected to a parallel copper bar having a level higher than the higher-level parallel copper bar, and terminals serving as AC sides of a part or all of the one or more power units 100 that are not connected to a parallel copper bar, which may be determined according to actual conditions and is not limited herein, all of which falls within the protection scope of the present disclosure. A last-level of the AC bus bar is the parallel confluence copper bar 43. The parallel confluence copper bar 43 may be connected to all highest-level parallel copper bars, or may be connected to all highest-level parallel copper bars and terminals serving as AC sides of all power units 100 that are not connected to a parallel copper bar, which depends on actual conditions and is not limited herein, all of which falls within the protection scope of the present disclosure.

In the aforementioned two implementations of the AC bus bar 40, each lowest-level parallel copper bar may be connected to a terminal serving as the AC side of the power unit through a connection point at any position on the lowest-level parallel copper bar. A parallel copper bar other than the lowest-level parallel copper bar may be connected to a next-level parallel copper bar through a connection point at any position of the parallel copper bar. The parallel confluence copper bar 43 may be connected to the highest-level parallel copper bar through a connection point at any position of the parallel confluence copper bar 43. The parallel confluence copper bar 43 may be connected to the AC output copper bar 80 through a connection point any position of the parallel confluence copper bar 43. The arrangement of the connection point is not limited to the above implementation, and may be selected according to actual conditions, all of which falls within the protection scope of the present disclosure.

It is to be noted that, the present disclosure is not limited to using copper bars to implement the parallel connection of the AC sides of power modules 100, and buses may alternatively be used to implement the parallel connection of the AC sides of power modules, which may be selected according to actual situations, all of which falls within the protection scope of the present disclosure.

In the power module 200, the power units 100 may be connected in parallel with each other by using any of the aforementioned connection manners, as long as it is ensured that paths passing through the power units 100 between the DC input bus 50 and the AC bus bar 40 have a same impedance, that is, paths between the DC input point DCin and an AC output point ACout have a same impedance, such that currents through the power units are the same, thereby reducing the difference between the currents and achieving the same current through the power units.

Hereinafter, the power module 200 including four power units 100 is taken as an example to illustrate the impedance between the DC input bus 50 and the AC bus 40 in detail.

Figure 7:
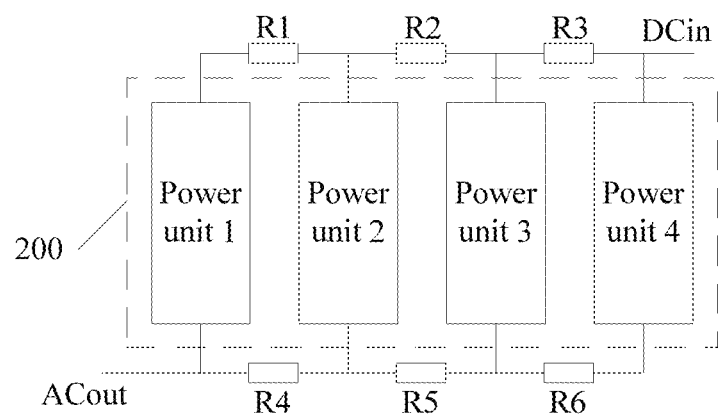
FIG. 7 is a schematic diagram of equivalent resistances between input terminals and equivalent resistances between output terminals of power units according to an embodiment of the present disclosure.

As shown in FIG. 7, it is assumed that the DC side of the rightmost power unit 100 is closest to the DC input point DCin, and the AC side of the leftmost power unit 100 is closest to the AC output point ACout. Further, equivalent impedances between DC sides of a power unit 1 and a power unit 2, a power unit 2 and a power unit 3, a power unit 3 and a power unit 4 are defined as a first impedance R1, a second impedance R2, and a third impedance R3 respectively. Equivalent impedances between AC sides of the power unit 1 and the power unit 2, the power unit 2 and the power unit 3, the power unit 3 and the power unit 4 are defined as a fourth impedance R4, a fifth impedance R5, and a sixth impedance R6 respectively.

In this case, there are four paths from the DC input point DCin to the AC output point ACout, which are described in the following.

A first path is from the DC input point DCin, through the power unit 4, the sixth impedance R6, the fifth impedance R5, the fourth impedance R4, and to the AC output point ACout.

A second path is from the DC input point DCin, through the third impedance R3, the power unit 3, the fifth impedance R5, the fourth impedance R4, and to the AC output point Acout.

A third path is from the DC input point DCin, through the third impedance R3, the second impedance R2, the power unit 2, the fourth impedance R4, and to the AC output point Acout.

A fourth path is from the DC input point DCin, through the third impedance R3, the second impedance R2, the first impedance R1, the power unit 1, and to the AC output point Acout.

In order to ensure that the same current flows through the four paths, it is required that a sum of the impedances R4, R5, and R6, a sum of the impedances R3, R4, and R5, a sum of the impedances R2, R3, and R4, and a sum of the impedances R1, R2, and R3 are equal to each other. That is, R4+R5+R6=R3+R4+R5=R2+R3+R4=R1+R2+R3, or a difference between any two of the above four sums is within an error range.

By arranging the parallel confluence copper bar 43 and the parallel copper bars in the aforementioned manner, the DC input point DCin of the DC input bus 50 and the AC output point ACout of the AC output copper bar 80 are respectively arranged at positions that are symmetrical to each other with respect to a central point of the power module 200, such as diagonal positions, such that the DC input point Dcin is away from the AC output point ACout as far as possible, thereby ensuring that the DC input bus 50 and the AC bus 40 have the same impedance in paths passing through all power units.

The DC input point DCin of the DC input bus 50 and the AC output point ACout of the AC output copper bar 80 may be respectively located at two corners of the power module 200 that are opposite to each other in a diagonal direction. For example, referring to FIG. 5, the parallel confluence copper bar 43 is connected to the first parallel copper bar 41 and the second parallel copper bar 42, such that the AC output point ACout is arranged at the lower left corner, and the DC input point DCin is arranged at the upper right corner. Of course, the positions of the AC output point ACout of the AC output copper bar 80 and the DC input point DCin of the DC input bus 50 may also be asymmetrical, as long as they are away from each other as far as possible and paths passing through all power units have the same impedance.

In applications, the power units may be connected in other manners, as long as it is ensured that the paths passing through all of the power units between the DC input bus 50 and the AC bus 40 have the same impedance, which is not described in detail herein.

In applications, the inverter further includes: a controller, a first driver board and a second driver board. One side of the first driver board is connected to control terminals on the first side of each of the at least two power units; one side of the second driver board is connected to the control terminal on the second side of each of the at least two power units; and another side of the first driver board and another side of the second driver board are connected to the controller.

The above configuration does not affects an original layout of driver boards in the inverter, and the power units share the two driver boards, thereby facilitating layout design of the driver boards. In applications, each power unit may be connected to a separate driver board.

Figure 6A:
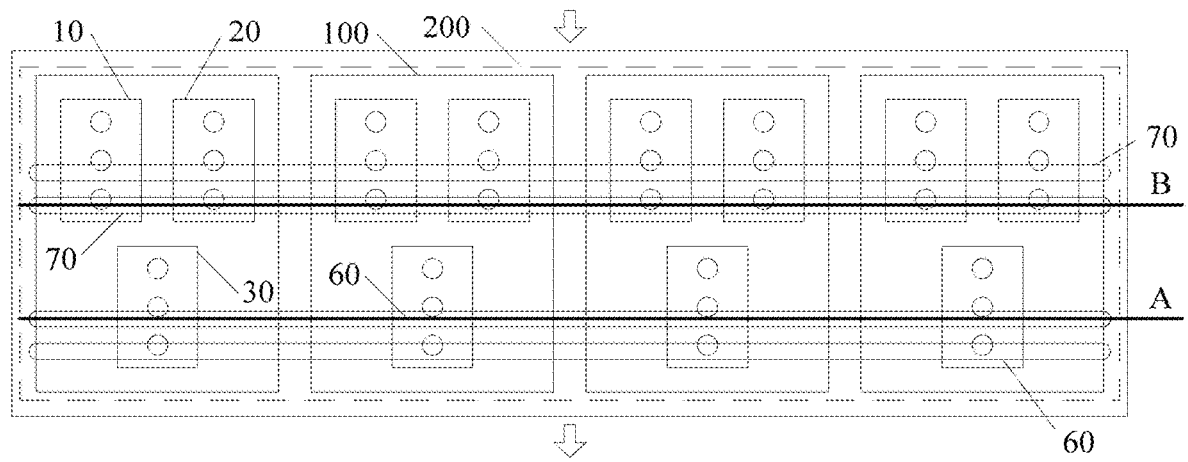
FIG. 6a is a schematic structural diagram of an inverter according to an embodiment of the present disclosure.
Figure 6B:
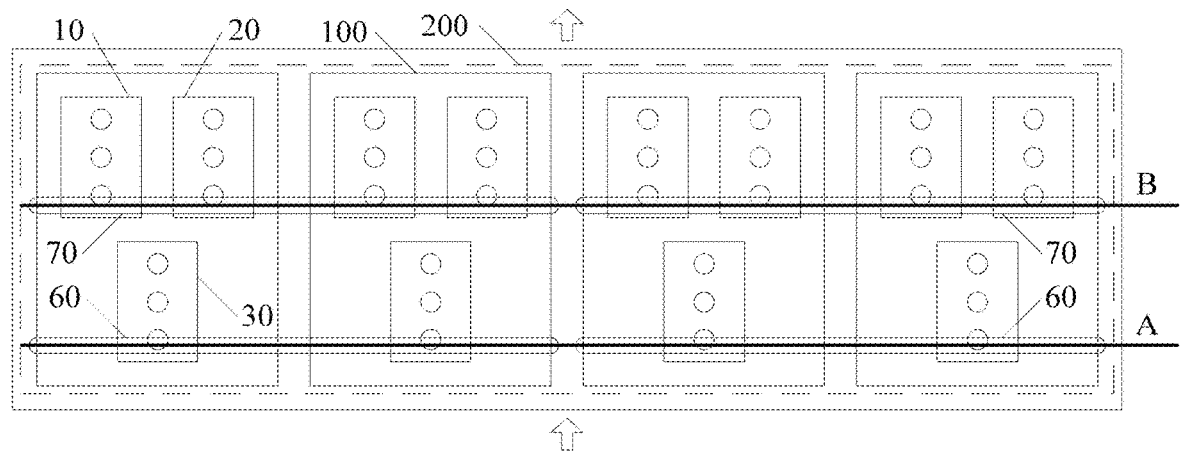
FIG. 6b is a schematic structural diagram of an inverter according to an embodiment of the present disclosure.

As shown in FIGS. 6a and 6b, an inverter is provided according to an embodiment of the present application, based on the aforementioned embodiment, the inverter further includes a radiator.

In the inverter, the at least two power units 100 in the power module 200 are sequentially arranged on the radiator.

In applications, the first package module 10 and the second package module 20 in each of the power units 100 are arranged at a cold air end of the radiator, and the third package module 30 in each of the power units 100 is arranged at a hot air end of the radiator. That is, the area where the package modules are densely arranged in each power unit 100 is arranged at the cold air end of the radiator, and the area where the package modules are sparsely arranged in each power unit 100 is arranged at the hot air end of the radiator. Thus, the heat dissipation speed of the area where the package modules are densely arranged in each power unit 100 is improved, and every part of each power unit 100 is properly dissipated, such that the temperature distribution on the radiator is more even, and heat accumulation in some areas is avoided. Each power unit 100 can make full use of the heat dissipation capacity of the radiator, thereby improving the heat dissipation efficiency of the inverter.

Figure 6C:
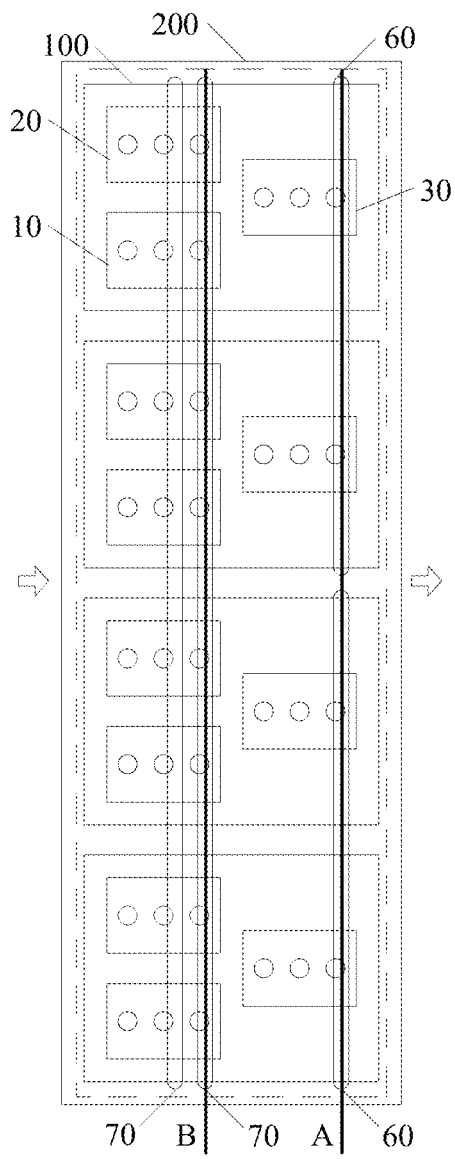
FIG. 6c is a schematic structural diagram of an inverter according to an embodiment of the present disclosure.
Figure 6D:
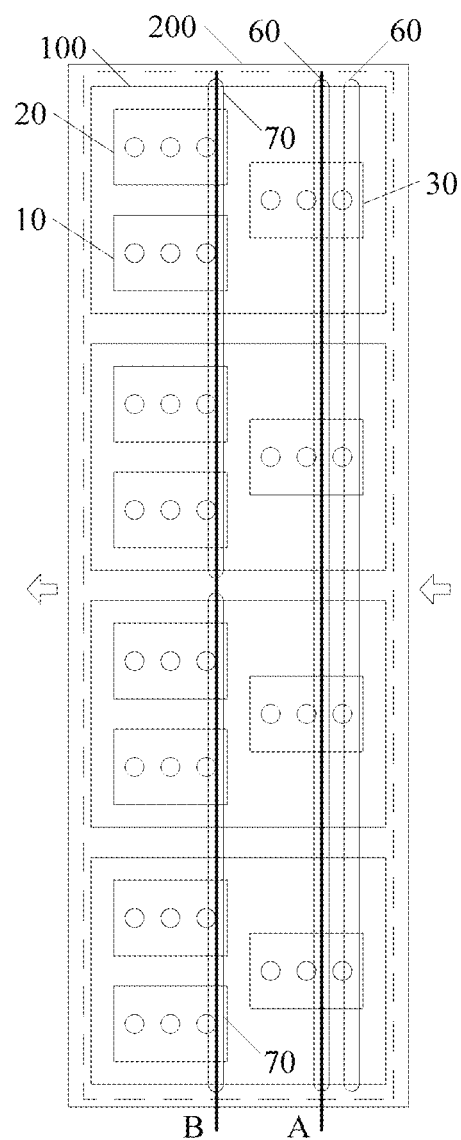
FIG. 6d is a schematic structural diagram of an inverter according to an embodiment of the present disclosure.

In an optional embodiment, in a case that the radiator adopts an air duct with an air inlet at an upper end and an air outlet at a lower end as shown in FIG. 6a, the upper end of the air duct is the cold air end, and the lower end of the air duct is the hot air end. In a case that the radiator adopts an air duct with the air outlet at the upper end and the air inlet at the lower end as shown in FIG. 6b, the upper end of the air duct is the hot air end, and the lower end of the air duct is the cold air end. In a case that the radiator adopts an air duct with the air inlet at a left end and the air outlet at a right end as shown in FIG. 6c, the left end of the air duct is the cold air end, and the right end of the air duct is the hot air end. In a case that the radiator adopts an air duct with the air outlet at the left end and the air inlet at the right end as shown in FIG. 6d, the left end of the air duct is the hot air end, and the right end of the air duct is the cold air end. The configuration of the air duct is not limited in the present disclosure, may be selected according to actual situations, all of which falls within the protection scope of the present disclosure.

As shown in FIGS. 6a, 6b, 6c and 6d, an inverter is provided according to an embodiment of the present application, based on the aforementioned embodiment, the inverter further includes at least one first heat pipe 60, and/or, at least one second heat pipe 70.

The number of the first heat pipe 60 and the second heat pipe 70 is not limited herein, and may be determined according to actual conditions.

In a case that the inverter includes the first heat pipe 60, each first heat pipe 60 passes across two or more of the at least two power units 100, and is arranged on a same cross section of halves of inner spaces for arranging the third package module of the power units, such as the cross-section A shown in FIG. 6a, to transfer heat from high temperature places to low temperature places.

For example, as shown in FIGS. 6a and 6c, the inverter includes two first heat pipes 60. The two first heat pipes 60 pass across four power units 100, and are arranged close to bottoms of the third package modules 30. The two first heat pipes 60 are arranged side by side with a certain distance apart, to give full play to their heat dissipation capacity.

For example, as shown in FIGS. 6b and 6d, the inverter includes two first heat pipes 60. One of the first heat pipes 60 passes across two adjacent power units 100, and is arranged close to bottoms of the third package modules 30. The other one of the first heat pipes 60 passes across another two adjacent power units 100, and is arranged close to bottoms of the third package modules 30.

It should be noted that, the aforementioned two arrangements of the first heat pipe 60 are merely illustrative, and the arrangement of the first heat pipe 60 includes but is not limited to the aforementioned two arrangements.

In a case that the inverter includes the second heat pipe 70, each second heat pipe 70 passes across two or more of the at least two power units 100, and is arranged on a same cross section of halves of the inner space of the power units where the first package module 10 and the second package module 20 are arranged, such as the cross-section area B shown in FIGS. 6a to 6d, to transfer heat from high temperature places to low temperature places.

For example, as shown in FIGS. 6a and 6d, the inverter includes two second heat pipes 70. The two second heat pipes 70 pass across four power units 100, and are arranged close to bottoms of the first package modules 10 and second package modules 20. The two second heat pipes 70 are arranged side by side with a certain distance apart, to give full play to their heat dissipation capacity.

For example, as shown in FIGS. 6b and 6c, the inverter includes two second heat pipes 70. One of the second heat pipes 70 passes across two adjacent power units 100, and is arranged close to bottoms of the first package modules 10 and the second package modules 20. The other one of the second heat pipes 70 passes across another two adjacent power units 100, and is arranged close to bottoms of the first package modules 10 and the second package modules 20.

It should be noted that, the aforementioned two arrangements of the second heat pipe 70 are merely illustrative, and the arrangement of the second heat pipe 70 includes but is not limited to the aforementioned two arrangements.

Due to the first heat pipe 60 and/or the second heat pipe 70, the heat may be transferred from places with a high temperature to places with a low temperature. The temperature at a same cross section (such as the cross section A and the cross section B) may be maintained to be the same to the greatest extent, that is, different power units 100 have the same temperature at the same cross section, thereby realizing overall uniform temperature of the power module 200.

The embodiments in this specification are described in a progressive manner. For the same or similar parts between the embodiments, one may refer to the description of other embodiments. Each embodiment lays emphasis on differences from other embodiments. Since the system embodiment is similar to the method embodiment, the description for the system embodiment is relatively simple. For related parts, reference may be made to description in the method embodiment. The system embodiment described above are merely illustrative, and units described as separate components may or may not be physically separated. The components shown as units may be or not be physical units, i.e., the units may be located at the same place or may be distributed onto multiple network units. All or a part of the modules may be selected based on actual needs to realize the objective of the solutions according to the embodiments. The solutions according to the embodiments can be understood and implemented by those skilled in the art without creative work.

The person skilled in the art can further appreciate that the elements and algorithm steps of each embodiment described in connection with the embodiments disclosed herein can be implemented in electronic hardware, computer software or a combination of both, in order to clearly illustrate the interchangeability of the hardware and software, the composition and steps of the various examples have been generally described in terms of function in the above description. Whether these functions are performed in hardware or software depends on the specific application and design constraints of the technical solution. The person skilled in the art can use different methods for implementing the described functions for each particular application; such implementation should not be considered to be beyond the scope of the present disclosure.

Based on the above description of the disclosed embodiments, those skilled in the art are capable of carrying out or using the present disclosure. It is obvious for those skilled in the art to make many modifications to these embodiments. The general principle defined herein may be applied to other embodiments without departing from the spirit or scope of the present disclosure. Therefore, the present disclosure is not limited to the embodiments illustrated herein, but should be defined by the broadest scope consistent with the principle and novel features disclosed herein.

The invention claimed is:

1. A power unit applied to an inverter, comprising: a first package module, a second package module, and a third package module, wherein:
    each of the first package module, the second package module and the third package module is provided with two switch transistors that are complementary to each other;
    the first package module and the second package module are arranged in one half of an inner space of the power unit, and the third package module is arranged in another half of the inner space of the power unit; and
    a control terminal of the first package module and a control terminal of the second package module are arranged on a first side of the power unit that is away from the half of the inner space for arranging the third package module, and a control terminal of the third package module is arranged on a second side of the power unit that is away from the half of the inner space for arranging the first package module and second package module, and an alternating current (AC) side of the power unit is configured to connect to an AC output copper bar of the inverter through an AC bus bar, wherein
    the AC bus bar comprises a parallel confluence copper bar, and the parallel confluence copper bar is configured to connect to the AC output copper bar and the AC side of the power unit; or
    the AC bus bar comprises a parallel confluence copper bar and at least one parallel copper bar, the parallel confluence copper bar is configured to connect to the AC output copper bar and the parallel copper bar, and the parallel copper bar is configured to connect to the AC side of the power unit.

2. The power unit according to claim 1, wherein the power unit has a three-level topology,
    two input terminals of the first package module are respectively connected to a positive electrode and a neutral point of the inverter on a direct current (DC) side of the inverter,
    two input terminals of the second package module are respectively connected to a negative electrode and the neutral point of the inverter on the DC side of the inverter,
    the two input terminals of the first package module and the two input terminals of the second package module serve as a DC side of the power unit,
    the output terminal of the first package module and the output terminal of the second package module are respectively connected to two input terminals of the third package module, and
    an output terminal of the third package module serves as the AC side of the power unit, and is connected to an AC side of the inverter.

3. The power unit according to claim 2, wherein the output terminal of the first package module and the output terminal of the second package module are respectively connected to the two input terminals of the third package module through copper bars.

4. The power unit according to claim 1, wherein the first package module, the second package module, and the third package module have a Y-shaped arrangement.

5. The power unit according to claim 1, wherein the power unit is configured as a 62 mm series IGBT module.

6. A power module applied to an inverter, comprising at least two power units according to claim 1, wherein
terminals serving as DC sides of the at least two power units are connected with each other in parallel, and terminals serving as AC sides of the at least two power units are connected with each other in parallel.

7. The power module according to claim 6, wherein:
output terminals of first package modules in the at least two power units are connected with each other through a first circulation bus; and
output terminals of second package modules in the at least two power units are connected with each other through a second circulation bus.

8. The power module according to claim 6, wherein the number of the at least two power units is 4.

9. An inverter, comprising: a DC input bus, an AC bus bar, an AC output copper bar, and the power module according to claim 6, wherein
terminals serving as DC sides of the at least two power units are connected to respective electrodes of the DC input bus;
terminals serving as AC sides of the at least two power units are connected to the AC output copper bar through the AC bus bar; and
paths passing through the at least two power units between the DC input bus and the AC bus bar have a same impedance.

10. The inverter according to claim 9, wherein a DC input point of the DC input bus and an AC output point of the AC output copper bar are respectively arranged at positions that are symmetrical to each other with respect to a central point of the power module.

11. The inverter according to claim 10, wherein the DC input point and the AC output point are respectively located at two corners of the power module that are opposite to each other in a diagonal direction.

12. The inverter according to claim 11, wherein in a case that the number of the at least two power units in the power module is four, and the AC bus bar comprises: a first parallel copper bar, a second parallel copper bar and a parallel confluence copper bar,
the first parallel copper bar is connected to terminals serving as AC sides of two of the four power units on a left side of the power module; the second parallel copper bar is connected to terminals serving as AC sides of another two of the four power units on a right side of the power module;
a left end of the parallel confluence copper bar is connected to a middle point of the first parallel copper bar, and a right end of the parallel confluence copper bar is connected to a left end of the second parallel copper bar; and
the left end of the parallel confluence copper bar is connected to the AC output copper bar, and the DC input point is arranged at an upper right corner of the power module.

13. The inverter according to claim 9, further comprising a radiator, wherein the at least two power unit are sequentially arranged on the radiator.

14. The inverter according to claim 13, wherein the first package module and the second package module in each of the at least two power units are arranged at a cold air end of the radiator, and the third package module in each of the at least two power units is arranged at a hot air end of the radiator.

15. The inverter according to claim 13, further comprising: at least one first heat pipe, and/or at least one second heat pipe, wherein
in a case that the inverter comprises the at least one first heat pipe, each of the at least one first heat pipe is arranged on a same cross section of halves of inner spaces for arranging the third package module, of two or more of the at least two power units; and
in a case that the inverter comprises the at least one second heat pipe, each of the at least one second heat pipe is arranged on a same cross section of halves of inner spaces for arranging the first package module and the second package module, of two or more of the at least two power units.

16. The inverter according to claim 9, further comprising: a controller, a first driver board, and a second driver board, wherein
one side of the first driver board is connected to the control terminals on the first side of each of the at least two power units;
one side of the second driver board is connected to the control terminal on the second side of each of the at least two power units; and
another side of the first driver board and another side of the second driver board are connected to the controller.

* * * * *